United States Patent
Ritt et al.

(10) Patent No.: US 8,159,379 B2
(45) Date of Patent: Apr. 17, 2012

(54) FAST READOUT METHOD AND SWITCHED CAPACITOR ARRAY CIRCUITRY FOR WAVEFORM DIGITIZING

(75) Inventors: Stefan Ritt, Lauchringen (DE); Roberto Dinapoli, Brugg (CH)

(73) Assignee: Paul Scherrer Institut, Villigen/PSI (CH)

( * ) Notice: Subject to any disclaimer, the term of this patent is extended or adjusted under 35 U.S.C. 154(b) by 82 days.

(21) Appl. No.: 12/677,342

(22) PCT Filed: Sep. 2, 2008

(86) PCT No.: PCT/EP2008/007155
§ 371 (c)(1),
(2), (4) Date: Mar. 10, 2010

(87) PCT Pub. No.: WO2009/043416
PCT Pub. Date: Apr. 9, 2009

(65) Prior Publication Data
US 2011/0090105 A1    Apr. 21, 2011

(30) Foreign Application Priority Data
Oct. 1, 2007    (EP) .................................... 07019247

(51) Int. Cl.
*H03M 1/00* (2006.01)
(52) U.S. Cl. ........................ 341/122; 341/141; 341/155
(58) Field of Classification Search .................. 341/141, 341/155
See application file for complete search history.

(56) References Cited

U.S. PATENT DOCUMENTS 5,892,384 A * 4/1999 Yamada et al. ................ 327/277
6,222,409 B1 * 4/2001 Kieda et al. ................... 327/283
(Continued)

FOREIGN PATENT DOCUMENTS
JP        03-192812 A        8/1991

OTHER PUBLICATIONS

Pegna, et al., "A GHz sampling DAQ system for the MAGIC-II telescope"; Nuclear Instruments and Methods in Physics Research, Section A, Feb. 15, 2007, pp. 382-384, vol. 572, No. 1, Elsevier, Amsterdam, NL.

(Continued)

*Primary Examiner* — Khai M Nguyen
(74) *Attorney, Agent, or Firm* — Laurence A. Greenberg; Werner H. Stemer; Ralph E. Locher

(57) ABSTRACT

A method relates to a technique for reducing the readout time of switched capacitor array circuitries. An implementation is a SCA chip capable of sampling 12 differential input channels at a sampling speed of 10 MSPS to 5 GSPS. The analog waveform can be stored in 1024 sampling cells per channel, and can be read out after sampling via a shift register. The write signal for the sampling cells is generated by a chain of inverters. The domino wave runs continuously until stopped. A read shift register clocks the contents of the sampling cells to outputs, where it can be digitized. It is possible to read out only a part of the waveform for reducing the digitization time. The high channel density, high analog bandwidth of 450 MHz, and low noise of 0.35 mV makes this chip suited for low power, high speed, high precision waveform digitizing.

4 Claims, 5 Drawing Sheets

U.S. PATENT DOCUMENTS 7,209,061 B2 * 4/2007 Somayajula ............... 341/122
2004/0114409 A1 6/2004 Breton et al.

OTHER PUBLICATIONS

Pegna, et al. "The DRS VME Board: a Low Power Digitizing System in the GHz Range"; Nuclear Physics B (Proceedings Supplements), Jan. 2006, pp. 70-73, vol. 150; Elsevier, Amsterdam, NL.

Ritt, "Fast waveform digitization with the DRS chip"; May 4, 2007, pp. 1-3, Batavia, IL.

Kleinfelder, "A Multi-GHz, Multi-Channel Transient Waveform Digitization Integrated Circuit"; Nov. 10-16, 2002, pp. 544-548, vol. 3 of 3; Norfolk, VA.

* cited by examiner

FAST READOUT METHOD AND SWITCHED CAPACITOR ARRAY CIRCUITRY FOR WAVEFORM DIGITIZING

BACKGROUND OF THE INVENTION

Field of the Invention

The present invention relates to a switched capacitor array circuitry and a method for fast waveform digitizing.

Many fields in industry and research require the digitization of waveforms at high sampling rates. This includes the readout of photomultipliers, gasous detectors and silicon detectors in particle physics experiments and synchrotron radiation sources. Traditionally, these applications use flash ADCs up to several GHz sampling speed, but this technology comes to its limit when high channel densities, low power and accuracies of more than 10 bits are needed. An alternative approach are switched-capacitor arrays (SCA).

Such a SCA chip has been developed for fast waveform digitizing of PMT and drift chamber signals for the MEG Experiment at the Paul Scherrer Institute, Switzerland. This experiment searches for the lepton-flavor violating decay $\mu^+ \to e^+\gamma$ with a sensitivity down to $10^{-13}$. The chip is fabricated in a 0.25 µm CMOS process and contains 12 channels, each with 1024 capacitive sampling cells. Waveform digitizing takes place with an on-chip generated frequency ranging from 10 MHz to 5 GHz. The cells are read out at 33 MHz with an external 12 bit flash ADC. A phase-locked-loop circuit (PLL) ensures high stability, making the chip suitable to replace both ADCs and TDCs in an experiment with a timing resolution below 100 ps and an ADC resolution equivalent of 14 bit.

However, when focusing on an extremely fast readout for single events, this technique suffers from the dead-time period required to read out all 1024 cells for each channel. Reading out the cells at 33 MHz, the device's deadtime lays in the range of 30 µs even if the readout is done in parallel by a dedicated ADC for each channel

BRIEF SUMMARY OF THE INVENTION

It is therefore the aim of presenting an invention to provide electronic circuitry having both a very fast readout and a in-deep time resolution capability that shortens the deadtime of the readout circuitry.

These aims are achieved related to the circuitry according to the present invention by a SCA circuitry for fast waveform digitizing, comprising:
a) a number of channels; each channel having a number of n sampling cells;
b) a domino wave circuit generating a domino wave as write signal for the sampling cells; said write signal for each individual cell is preferably generated by a series of n double inverters;
b) each sampling cell receiving and storing a snapshot of the waveform when the respective sampling cell is in turn according to the respective write signal;
c) a stop circuit for receiving an external or internal trigger signal in order to disempower the domino wave after an external or internal delay for a predetermined amount of time and to generate a stop position pulse;
d) a register being preset with the position of the domino wave at the stop pulse and being read out in a serial or parallel way for reading the stop position when the domino wave was disempowered; and
e) a readout circuit for consecutively reading out the sampled signal in a predetermined number of the sampling cells, thereby starting the readout at the sampling cell corresponding to the stop position.

These aims are achieved related to the method according to the present invention by a method for fast waveform digitizing, comprising the steps of:
a) providing a circuitry comprising a number of channels; each channel having a number of n sampling cells;
b) generating a domino wave as write signal for the sampling cells; said write signal for each individual cell is preferably generated by a series of n double inverters;
b) receiving and storing in each sampling cell a snapshot of the waveform form when the respective sampling cell is in turn according to the respective write signal;
c) providing a stop wave circuit for receiving an external or internal trigger signal in order to disempower the domino wave after an external or internal delay for a predetermined amount of time and to generate a stop position pulse;
d) providing a register being preset with the position of the domino wave at the stop pulse and being read out in a serial or parallel way for reading the stop position when the domino wave was disempowered; and
e) reading out the sampled signals in a predetermined number of the sampling cells, thereby starting the readout at the sampling cell corresponding to the stop position.

By reading only this subset of sampling cells, the chip is best suited for all applications which have a distinct interest in short pulses resolution, such as the readout of photo-multipliers, drift chambers and silicon detectors. Depending on the number of sampling cells to be read out the dead time for the readout and digitization is reduced by the fraction of the time required to read the subset of sampling cells divided by the time required to read the entity of all sampling cells.

A suitable architecture to allow for the domino effect like activation of the sampling cells provides a switched capacitor array chip, wherein the first inverter of said double inverters is designed as an AND gate having as one input signal a disenable signal, said first inverter is connected via an NMOS transistor operated as a voltage controlled resistor to the second inverter; thereby forming with the parasitic capacitance of the second inverter an RC-circuit. This architecture allows to enable and to disempower the domino wave at any time via the DENABLE signal. The flexibility of imposing a variable delay for the propagation of the domino wave is herein achieved by controlling an analog voltage DSPEED that is connected to the gate terminal of the NMOS transistor.

Another preferred embodiment of the present invention provides a switched capacitor array chip, wherein the stop position of the domino wave is encoded in binary 10-bit word and read out by a shift register within 10 clock cycles.

Preferred embodiments of the present invention are hereinafter described with reference to the following drawings which depict in:

DESCRIPTION OF THE INVENTION

Figure 1:
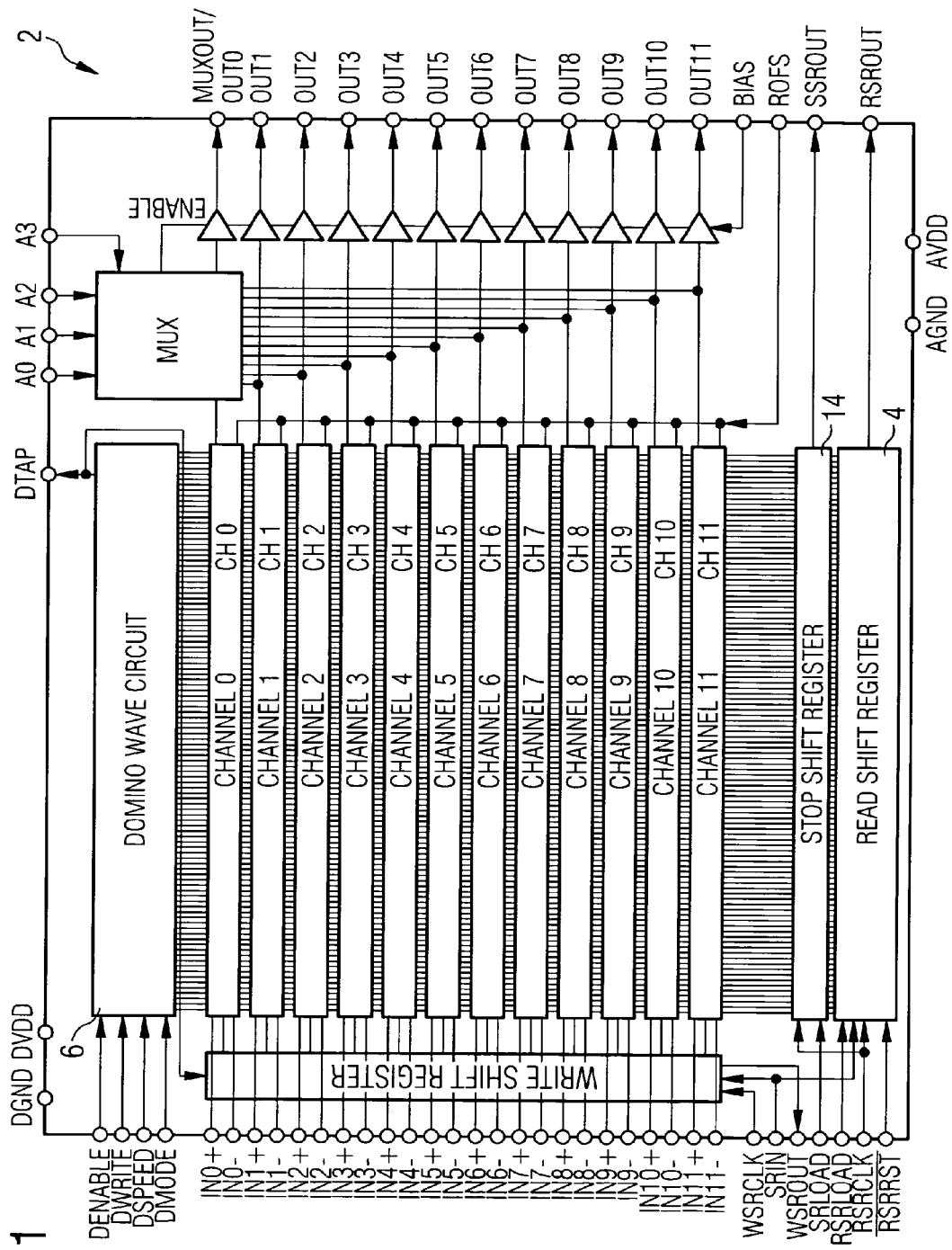
FIG. 1 a functional block diagram of the switched capacitor array chip.
Figure 5:
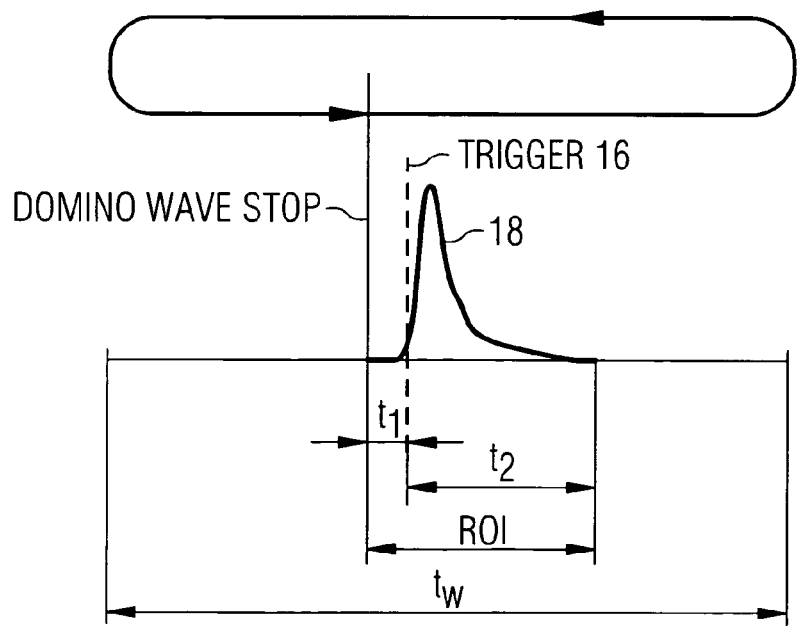
FIG. 5 a diagram of the Region-of-Interest (ROI) readout mode.

The present invention as shown as a functional block diagram in FIG. 1 represents a SCA chip 2 capable of sampling 12 differential input channels CH0 to CH11 at a sampling speed of 10 MSPS to 5 GSPS. An analog signal waveform 18 (see FIG. 5) is stored in 1024 sampling cells CELL0 to CELL1023 per channel CH0 to CH11, and can be read out after sampling via a read shift register 4 clocked at 33 MHz for external digitization. A write signal for the sampling cells CELL0 to CELL1023 is generated by a chain of inverters (domino principle) generated in a domino wave circuit 6 on the chip 2. The domino wave is running continuously until stopped by a trigger signal putting DENABLE low. (It has to be remarked that the domino wave is still running but is decoupled from the sampling cells and has therefore no effect on the waveform sampling as long as the DENABLE signal is set low. The read shift register 4 clocks the contents of the sampling cells either to a multiplexed output MUX or to individual outputs OUT0 to OUT11, where it can be digitized with an external ADC (not shown). It is possible according to the present invention to read out only a part of the waveform for reducing the digitization time. The high channel density, high analog bandwidth of 450 MHz, and low noise of 0.35 mV (after offset calibration) makes this chip ideally suited for low power, high speed, high precision waveform digitizing. The chip is fabricated on an advanced CMOS process in a radiation hard design to foster its use in hard radiation environments.

The chip comprises an on-chip inverter chain generating a sampling frequency up to 5.5 GHz (domino wave circuit 6). This signal opens write switches in all 12 sampling channels CH0 to CH11, where the differential input signal is sampled in small (200 fF) capacitors. After being started, the domino wave runs continuously in a circular fashion until "stopped" by a trigger signal, which freezes the currently stored signal in the sampling capacitors. The signal is then read out via the read shift register 4 for external digitization.

Figure 2:
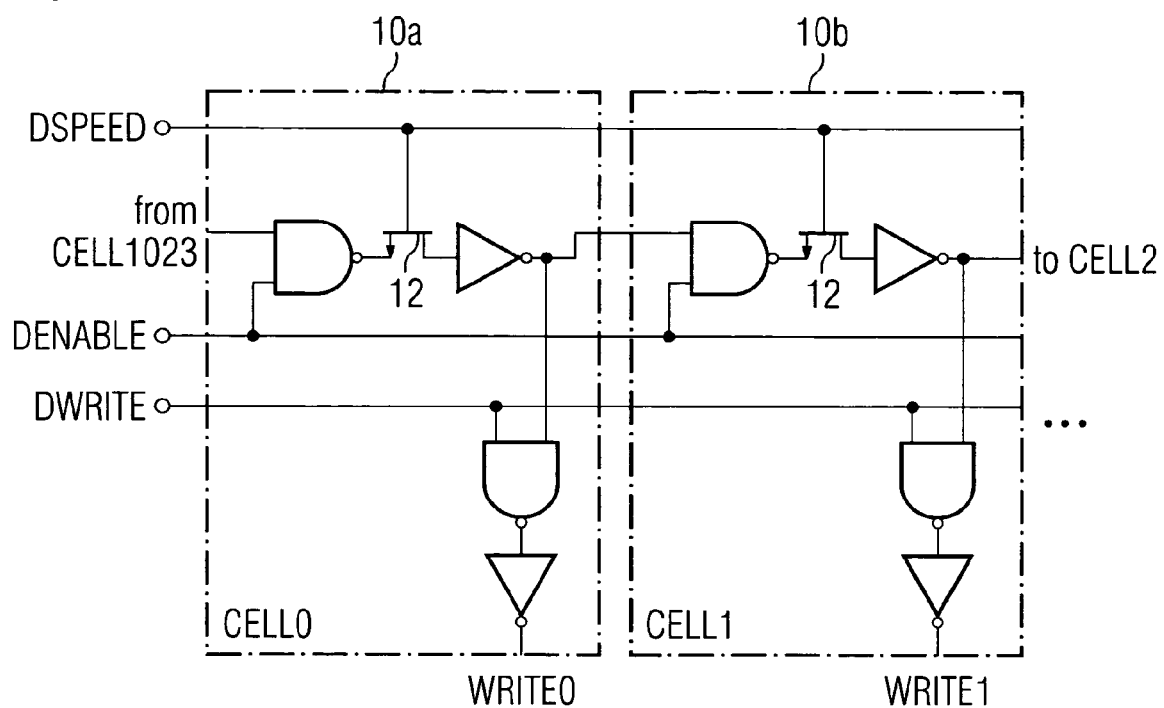
FIG. 2 a simplified schematic diagram of two out of 1024 double inverter blocks forming the domino wave circuit.

The domino wave circuit 6 is basically a series of 1024 double inverters 10a, 10b. After raising the DENABLE signal high, a wave traverses through these inverters 10a, 10b producing the write signal for the sampling cells. FIG. 2 shows a simplified schematics of two double inverter blocks 10a, 10b. The first inverter 10a is actually an AND gate. This allows to enable and to stop the domino wave at any time via the DENABLE signal. The AND gate is connected to the following inverter via an NMOS transistor 12 operating as a voltage controlled resistor. This resistor forms with the parasitic input capacitance of the inverter 10b an RC-circuit, imposing a variable delay for the propagation of the domino wave, which can be controlled by an analog voltage DSPEED. Since the actual domino wave speed depends on the power supply voltage and the temperature, some stabilization is necessary to ensure steady operation. For this purpose, a DTAP signal is available, which toggles its state each time the domino wave reaches cell #512. If operating the chip at $f_{DOMINO}$, the DTAP outputs a rectangular signal with 50% duty cycle with a frequency according to following formula:

$$f_{DTAP} = \frac{1}{2048} \times f_{DOMINO}$$

This signal can be used by an external PLL circuit to lock the domino frequency and phase to a quartz generated frequency. An alternative approach is to feed this signal into a frequency counter implemented in a FPGA, and to correct the DSPEED signal via a 16-bit DAC in case of a deviation.

The domino wave gets started by raising the DENABLE signal high. An internal circuit ensures that the write signal is always 16 cells wide. The DWRITE signal determines if the write signal is sent to the sampling cells CELL0 to CELL1023. If using an external PLL circuit, it might be advantageous to keep the domino wave running during the readout phase. This can be achieved by keeping DENABLE high and only lowering DWRITE to stop the sampling process. In this case, the DTAP signal is also produced by the revolving domino wave during readout.

A small timing jitter is present between the double inverter blocks 10a, 10b. This jitter is composed of a constant deviation for each cell (the so-called "fixed pattern jitter") arising from the mismatch of the transistors 12 in each cell, and a variable term for each domino revolution. While the overall jitter can be minimized by using an external PLL, a cell-to-cell variation will still be present. If applications require high timing accuracy, the fixed pattern jitter can be calibrated and corrected for. Since one domino wave circuit controls all 12 channels CH0 to CH11 inside the chip 2, only one channel CH0 to CH11 for each chip 2 needs to be calibrated. One possibility to do this is to sample a high accurate sine wave with the chip, and look for deviations between the sampled waveform and the ideal one obtained from a sine fit of all samples. Averaging over many waveforms at different phases of the sine wave, the fixed pattern jitter can be measured and stored for calibration in a database for example.

An additional complication might arise from the fact that the domino wave can only be stopped between cells. This gives a timing accuracy of $1/f_{DOMINO}$. If higher accuracy is needed, it is recommended to sample a highly stable clock signal in one of the 12 channels CH0 to CH11 of each chip. By fitting the edges of this clock signal, the actually sampling frequency and phase for each waveform can be measured precisely, and a timing accuracy below 100 ps can be achieved.

Figure 3:
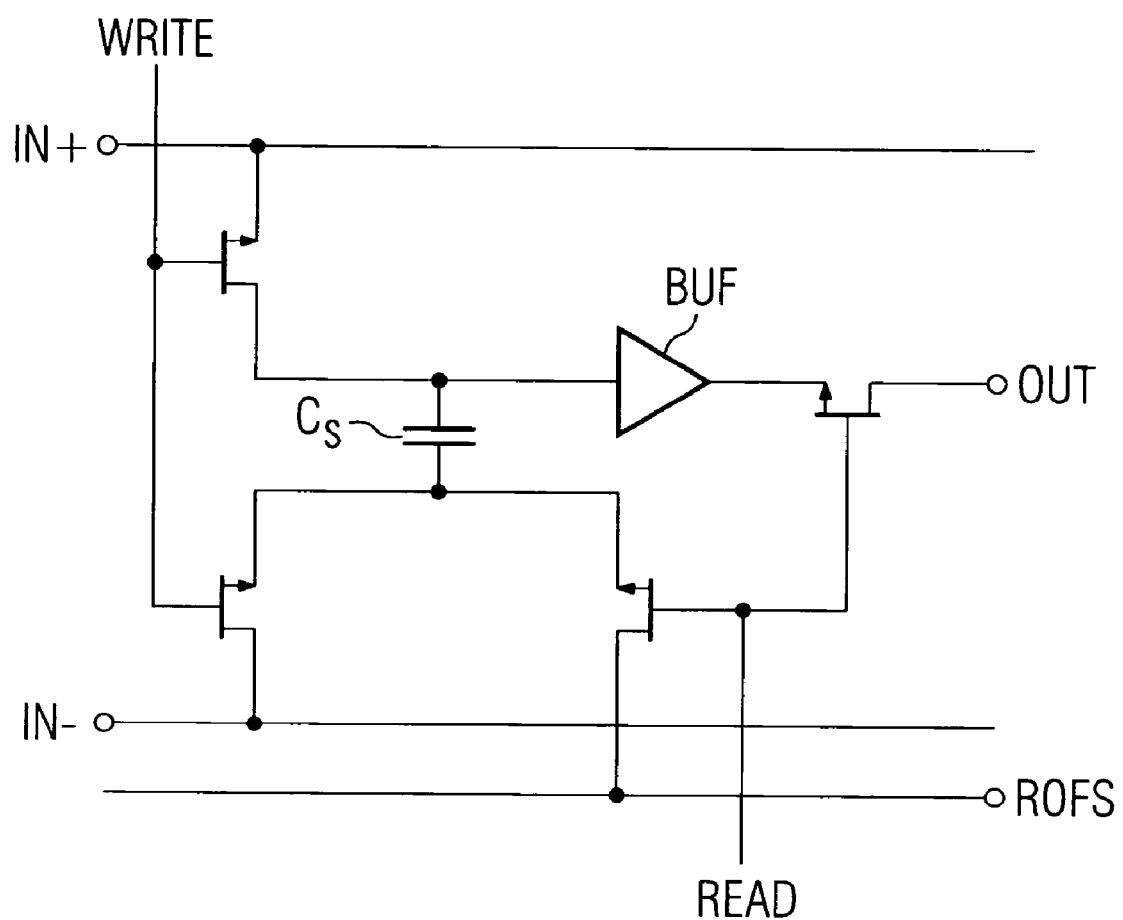
FIG. 3 a simplified schematic sketch of a sampling Cell.
Figure 4:
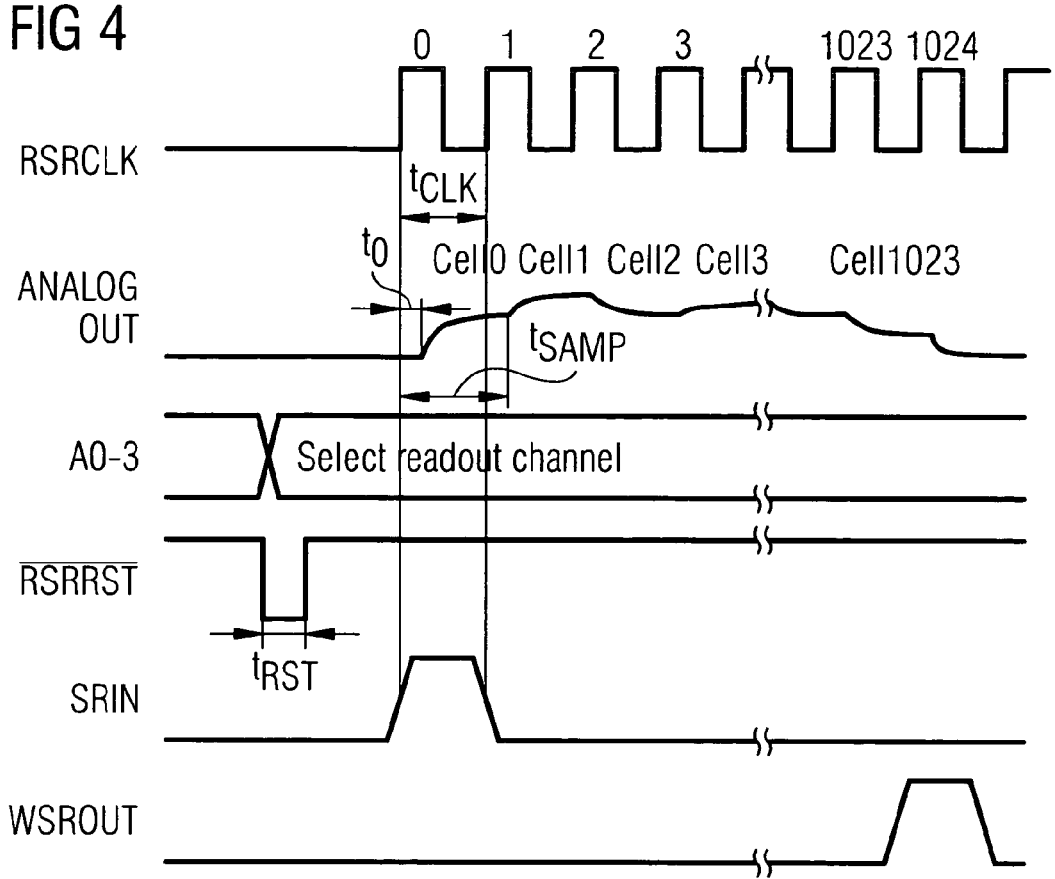
FIG. 4 a Readout Shift Register Timing Diagram.

Each sampling cell CELL0 to CELL1023 comprises a sampling capacitor with $C_s$=200 fF connected to the IN+ and IN− inputs via two NMOS transistors (see FIG. 3). This allows a quasi differential input, given than both input signals do not exceed the rails of the power supply. It has to be insured that the signal source has enough driving capability to deliver the current to charge the capacitors $C_S$. At 5 GHz sampling speed, an input current of 1 mA in necessary to charge the capacitors $C_S$ with a 1 V signal for example. After the sampling cycle, the capacitor stores the voltage $$U_s = U_{IN+} - U_{IN-}$$

Since the NMOS transistors 12 show a nonlinear behavior when approaching the rails, it is recommended to operate them between 0.1 V and 1.5 V. The full range is limited by the linearity of the buffer in each cell, which shows a non-linearity better than 0.5 mV for an input voltage between 1.05 V and 2.05 V. If signals smaller than 1.05 V should be sampled, it is possible to shift $U_s$ up by applying an external voltage ROFS during the readout phase. This works similar like a charge pump, lifting the bottom plate of the capacitor from IN− to ROFS. The voltage seen by the buffer during readout is therefore $$U_S' = U_{IN+} - U_{IN-} + U_{ROFS}$$

An input range of 0.1 V to 1.1 V can therefore be obtained for example by applying 0.95 V to the ROFS input. This shifts the input signal into the linear range of 1.05 V to 2.05 V of the cell buffer. The chip has an additional buffer at each analog output, which then shifts this output to a range from approximately 0.8 V to 1.8 V. The overall gain of the analog chain is 0.985. The input signal both at the IN+ and the IN− input should not exceed 1.5 V. It should be noted that the charge stored in the sampling capacitor $C_S$ is lost over time due to charge leakage, and the readout of a sampling cell CELL0 to CELL1023 should be done quickly (<1 ms) after the sampling.

After sampling has been stopped by either setting DENABLE or DWRITE low, the waveform can be read out via the read shift register 4. To do so, a single "1" is clocked into the shift register, followed by 1024 clock cycles at 33 MHz.

Pulling $\overline{RSRRST}$ low for at least 10 ns while RSRCLK and SRIN are low erases the contents of the read shift register 4. A "1" is clocked into the first cell of the register at the falling edge of RSRCLK. This "read bit" is then shifted down on each consecutive clock cycle, until it appears at the $1024^{th}$ cycle at WSROUT indicating successful operation of the shift register. On the rising edge of RSRCLK at each clock cycle the contents of the next sampling cell appears at the analog output MUXOUT after a delay of $t_O$=10 ns if the multiplexer is used. When operated at 33 MHz clock speed ($t_{CLK}$=30 ns), the analog signal has 30 ns to settle at the output. Care must be taken to sample it with an external flash ADC at the end of this 30 ns period, but just before the beginning of the next cycle. So with $t_{SAMP}=t_O+t_{CLK}$=40 ns the sampling should occur about 38 ns after the rising edge of RSRCLK. Sampling the signal after 35 ns already degrades the linearity.

Since each sampling cell CELL0 to CELL1023 contains a buffer at the output, an offset error from that buffer is seen due to the mismatch of the transistors inside the buffer, which is typically 5 mV rms. Since this offset error is constant over time ("fixed pattern noise"), it can be measured and corrected for during the readout. One example to do this is to put an offset correction table into the FPGA which does the readout of the ADC connected to the chip 2. This way the noise can be reduced by more than one order of magnitude.

Four address bits A0-A3 are used to configure the analog output. In multiplexed mode, each channel's analog output can be routed to one single output MUXOUT, making it possible to use only a single external ADC to digitize all 12 channels. If digitization time however is important, all 12 channels can be digitized in parallel using 12 external ADCs, thus reducing the digitization time by a factor of 12.

TABLE 2

Address Bit Settings

| A0 | A1 | A2 | A3 | Output |
|---|---|---|---|---|
| 0 | 0 | 0 | 0 | Channel 0 at MUXOUT |
| 1 | 0 | 0 | 0 | Channel 1 at MUXOUT |
| 0 | 1 | 0 | 0 | Channel 2 at MUXOUT |
| 1 | 1 | 0 | 0 | Channel 3 at MUXOUT |
| 0 | 0 | 1 | 0 | Channel 4 at MUXOUT |
| 1 | 0 | 1 | 0 | Channel 5 at MUXOUT |
| 0 | 1 | 1 | 0 | Channel 6 at MUXOUT |
| 1 | 1 | 1 | 0 | Channel 7 at MUXOUT |
| 0 | 0 | 0 | 1 | Channel 8 at MUXOUT |
| 1 | 0 | 0 | 1 | Channel 9 at MUXOUT |
| 0 | 1 | 0 | 1 | Channel 10 at MUXOUT |
| 1 | 1 | 0 | 1 | Channel 11 at MUXOUT |
| 0 | 0 | 1 | 1 | Don't use (internal test purpose only) |
| 1 | 0 | 1 | 1 | Don't use (internal test purpose only) |
| 0 | 1 | 1 | 1 | Enable OUT0-OUT11 |
| 1 | 1 | 1 | 1 | Disable all outputs (standby) |

Setting all address bits to one disables all analog output drivers, reducing the power consumption to 2 mA for the complete chip.

A dedicated feature according to the present invention is the capability of reading out as certain time frame as Region-of-Interest (ROI) readout. The digitization of all 1024 samples at 33 MHz takes 30 μs, even if the 12 channels are digitized in parallel. During this time the sampling of the chip is stopped and no new waveforms can be acquired. To reduce this dead time it is possible to read only a subset of all sampling cells, for applications where one is interested only in short pulses like illustrated in FIG. 5.

Figure 6:
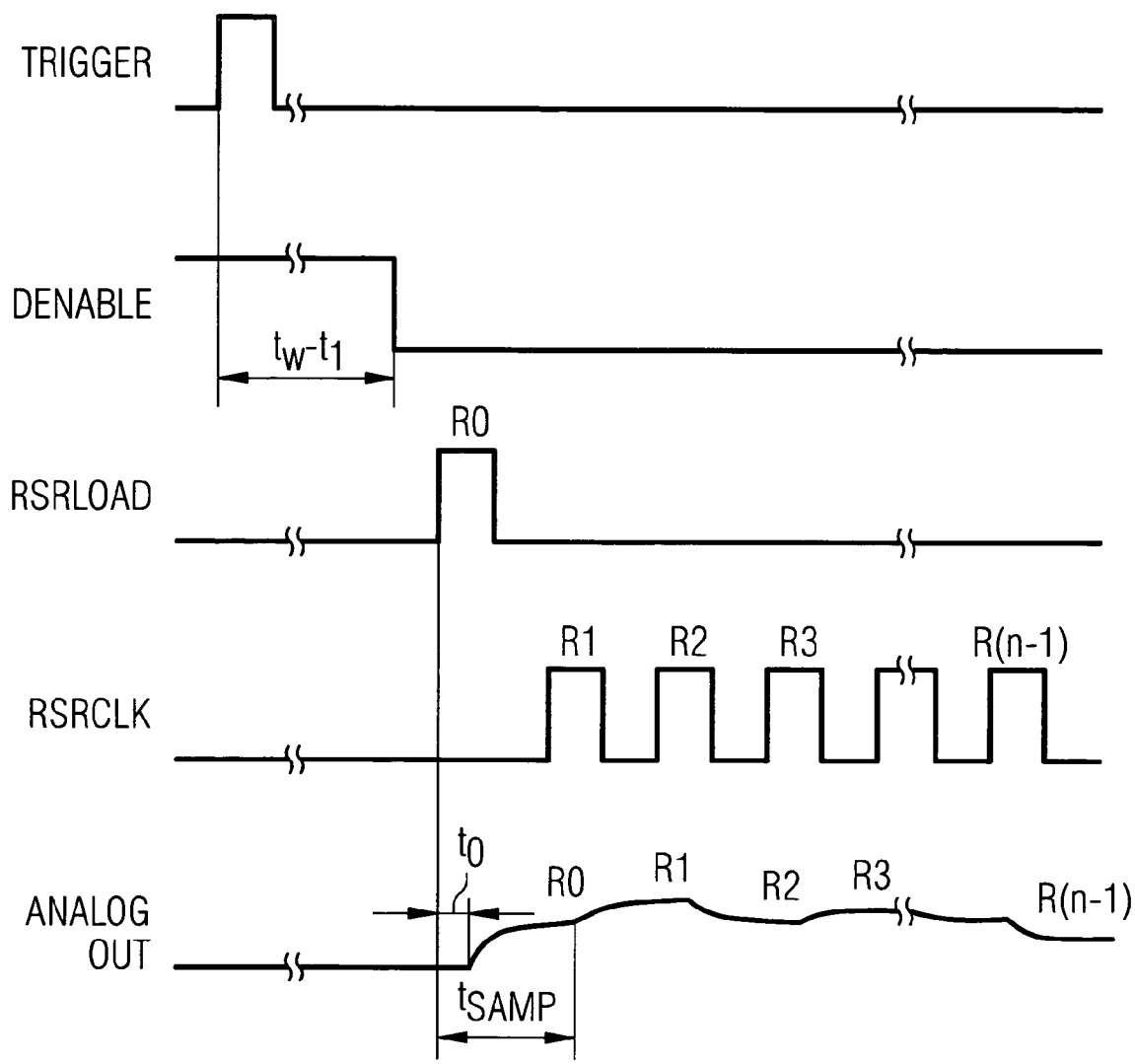
FIG. 6 a timing diagram for the ROI readout.

Assume that the domino wave is running with a window size $t_W=1024\times 1/f_{SAMP}$, and a short signal occurs, like a hit from a photomultiplier. This signal triggers an external trigger circuit (not shown), similar like in an oscilloscope. The interesting part of the waveform is now in a region $t_1$ before and $t_2$ after that trigger point 16. If only this ROI is read out, the dead time will be reduced by the fraction $(t_1+t_2)/t_W$. To achieve this with the chip, the domino wave has to be stopped $t_W-t_1$ after the trigger point 16 by means of an external delay. The stop position of the domino wave is then transferred into the readout shift register 4 via a pulse on the RSRLOAD pin. The readout starts at this position and can be stopped after n samples when the complete ROI is covered. FIG. 6 shows the timing for this readout mode.

The rising edge of the RSLOAD pin transfers the first sample R0 of the ROI to the analog output, where it can be digitized after ($t_{SAMP}$–2 ns). Consecutive pulses on RSRCLK transfer following samples $R_i$, until all n samples are digitized. This sequence can be repeated 12 times to digitize all channels CH0 to CH11 if multiplexing is used. Each pulse on RSLOAD re-transfers the domino wave stop position into the read shift register 4, so the same ROI can be digitized on all channels CH0 to CH11. If the read bit arrives at cell #1023, it is seen at the RSROUT output, and then wraps around automatically into cell #0.

The invention claimed is:

1. A switched capacitor array circuitry for fast waveform digitizing, comprising:

a number of channels each having a number n of sampling cells;

a domino wave circuit connected to said sampling cells and generating a domino wave as a write signal for said sampling cells, said domino wave circuit having a series of n double inverters for generating the write signal for each of said sampling cells, each of said sampling cells receiving and storing a snapshot of a waveform when a respective one of said sampling cells is in turn according to a respective write signal;

a stop circuit for receiving one of an external trigger signal and an internal trigger signal to disempower the domino wave after one of an external delay and an internal delay for a predetermined amount of time and to generate a stop position pulse;

a register being preset with a position of the domino wave at the stop position pulse and being read out in one of a serial way and a parallel way for reading a stop position when the domino wave was disempowered;

a readout circuit for consecutively reading out a sampled signal in a predetermined number of said sampling cells, thereby starting a readout at said sampling cell corresponding to the stop position;

said series of double inverters including:
an NMOS transistor operating as a voltage controlled resistor;
a first inverter being an AND gate having an input receiving a disenable signal; and
a second inverter, said first inverter is connected via said NMOS transistor to said second inverter, thereby forming with a parasitic capacitance of said second inverter a RC-circuit.

2. The switched capacitor array circuitry according to claim 1, further comprising a common readout shift register to which the stop position pulse can be transferred for readout.

3. A method for fast waveform digitizing, which comprises the steps of:
   providing circuitry having a number of channels, each of the channels having a number n of sampling cells;
   generating a domino wave as a write signal for the sampling cells, the write signal for each of the sampling cells is generated by a series of n double inverters;
   receiving and storing in each of the sampling cells a snapshot of a waveform when a respective sampling cell is in turn according to a respective write signal;
   providing a stop wave circuit for receiving one of an external trigger signal and an internal trigger signal to disempower the domino wave after one of an external delay and an internal delay for a predetermined amount of time and to generate a stop position pulse;
   providing a register being preset with a stop position of the domino wave at the stop position pulse and being read out in one of a serial way and a parallel way for reading the stop position at the sampling cell which was the last to receive and store a snapshot of the waveform before the domino wave was disempowered;
   reading out sampled signals in a predetermined number of the sampling cells, thereby starting a readout at the sampling cell corresponding to the stop position; and
   configuring a first inverter of the double inverters as an AND gate having as one input signal a disenable signal, the first inverter is connected via an NMOS transistor operated as a voltage controlled resistor to a second inverter, thereby forming with a parasitic capacitance of the second inverter a RC-circuit.

4. The method according to claim 3, which further comprises providing a common readout shift register to which the stop position pulse can be transferred for readout.

* * * * *